US010410890B2

(12) United States Patent
Ranish et al.

(10) Patent No.: US 10,410,890 B2
(45) Date of Patent: Sep. 10, 2019

(54) LIGHT PIPE WINDOW STRUCTURE FOR THERMAL CHAMBER APPLICATIONS AND PROCESSES

(71) Applicant: Applied Materials, Inc., Santa Clara, CA (US)

(72) Inventors: Joseph M. Ranish, San Jose, CA (US); Aaron Muir Hunter, Santa Cruz, CA (US); Anzhong Chang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 713 days.

(21) Appl. No.: 14/297,240

(22) Filed: Jun. 5, 2014

(65) Prior Publication Data

US 2014/0376897 A1 Dec. 25, 2014

Related U.S. Application Data

(60) Provisional application No. 61/956,997, filed on Jun. 21, 2013.

(51) Int. Cl.
*H01L 21/67* (2006.01)
*G02B 6/00* (2006.01)
(Continued)

(52) U.S. Cl.
CPC .......... *H01L 21/67115* (2013.01); *G02B 6/00* (2013.01); *G02B 6/08* (2013.01);
(Continued)

(58) Field of Classification Search
CPC ......... H01L 21/67115; H01L 21/67109; G02B 6/0006; G02B 6/00; G02B 6/08; G02B 6/4249; B60K 2350/203; F24H 3/0405
(Continued)

(56) References Cited

U.S. PATENT DOCUMENTS 1,914,454 A * 6/1933 Noble ...................... H05B 3/84
219/203
2,179,934 A * 11/1939 Jones ...................... H05B 3/748
219/460.1
(Continued)

FOREIGN PATENT DOCUMENTS

CN 103109359 A 5/2013
JP 2001-521296 A 11/2001
(Continued)

OTHER PUBLICATIONS

PCT Notification of Transmittal of the International Search Report and the Written Opinion of the International Searching Authority for International Application No. PCT/US2014/041832 dated Oct. 27, 2014; 11 total pages.
(Continued)

*Primary Examiner* — Jimmy Chou
(74) *Attorney, Agent, or Firm* — Patterson + Sheridan LLP

(57) ABSTRACT

A processing chamber is described. The processing chamber includes a chamber having an interior volume, a light pipe window structure coupled to the chamber, the light pipe window structure having a first transparent plate disposed within the interior volume of the chamber, and a radiant heat source coupled to a second transparent plate of the light pipe window structure in a position outside of the interior volume of the chamber, wherein the light pipe window structure includes a plurality of light pipe structures disposed between the first transparent plate and the second transparent plate.

17 Claims, 7 Drawing Sheets

(51) Int. Cl.
*G02B 6/42* (2006.01)
*G02B 6/08* (2006.01)

(52) U.S. Cl.
CPC ......... *G02B 6/4249* (2013.01); *G02B 6/4296* (2013.01); *H01L 21/67109* (2013.01)

(58) Field of Classification Search
USPC .......... 392/411, 416, 350; 326/253; 219/411, 219/390; 118/715; 358/250
See application file for complete search history.

(56) References Cited

U.S. PATENT DOCUMENTS

| | | | | |
|---|---|---|---|---|
| 3,409,759 A * | 11/1968 | Livingston | ........ | B32B 17/10761 156/99 |
| 3,615,313 A * | 10/1971 | Phaneuf | ................ | C03B 37/028 385/116 |
| 3,909,109 A * | 9/1975 | Aurenz | .................... | G02B 6/08 355/1 |
| 3,919,543 A * | 11/1975 | Noren | ................. | F21S 48/2218 362/290 |
| 4,275,965 A * | 6/1981 | Snitzer | .................... | G01D 5/268 250/237 G |
| 4,293,892 A * | 10/1981 | Plummer | ................... | F21V 5/04 362/17 |
| 4,378,956 A * | 4/1983 | Lester | .................... | G02F 1/1313 340/815.42 |
| 4,489,234 A * | 12/1984 | Harnden, Jr. | ............. | B32B 3/12 219/460.1 |
| 4,525,772 A * | 6/1985 | Peck | ................... | F21S 48/2218 362/290 |
| 4,573,082 A * | 2/1986 | Jeskey | .................... | G02B 5/00 313/475 |
| 4,586,780 A * | 5/1986 | Chern | ..................... | G02B 5/32 359/294 |
| 4,659,176 A * | 4/1987 | Mori | ........................ | F21S 11/00 385/33 |
| 5,145,716 A * | 9/1992 | Paserin | ................. | C23C 16/481 118/50.1 |
| 5,155,336 A * | 10/1992 | Gronet | ................. | C23C 16/481 219/390 |
| 5,206,474 A * | 4/1993 | Fukuoka | ................ | B23K 9/127 219/124.34 |
| 5,215,588 A * | 6/1993 | Rhieu | ............... | C23C 16/45519 118/715 |
| 5,448,037 A * | 9/1995 | Takase | ............. | B32B 17/10174 219/203 |
| 5,487,127 A * | 1/1996 | Gronet | ................. | C23C 16/481 118/50.1 |
| 5,781,693 A * | 7/1998 | Ballance | ........... | C23C 16/45565 118/724 |
| 5,798,499 A * | 8/1998 | Shibata | .................... | H05B 3/84 219/203 |
| 5,830,277 A * | 11/1998 | Johnsgard | ........... | C23C 16/481 118/666 |
| 5,840,125 A * | 11/1998 | Gronet | ................. | C23C 16/481 118/50 |
| 5,965,047 A | 10/1999 | Blersch et al. | | |
| 6,016,383 A * | 1/2000 | Gronet | ................. | C23C 16/481 219/405 |
| 6,072,160 A * | 6/2000 | Bahl | ....................... | C30B 31/12 219/405 |
| 6,075,922 A * | 6/2000 | Tay | ........................ | F26B 21/10 392/416 |
| 6,090,210 A * | 7/2000 | Ballance | ........... | C23C 16/45565 118/50.1 |
| 6,108,490 A * | 8/2000 | Lee | ....................... | C23C 16/481 118/724 |
| 6,156,079 A * | 12/2000 | Ho | .................... | H01L 21/67115 118/725 |
| 6,284,051 B1 * | 9/2001 | Fidelman | .............. | C23C 16/481 118/50.1 |
| 6,310,328 B1 * | 10/2001 | Gat | .................... | H01L 21/67115 118/725 |
| 6,575,622 B2 * | 6/2003 | Norrbakhsh | ............ | C30B 25/16 219/497 |
| 6,751,019 B2 * | 6/2004 | DeSanto | ................... | G02B 6/08 353/122 |
| 6,794,882 B2 * | 9/2004 | Jessup | .................... | G08B 13/04 219/509 |
| 6,883,946 B1 * | 4/2005 | Kolar | ..................... | F21V 11/06 362/290 |
| 7,015,422 B2 * | 3/2006 | Timans | ................. | C23C 16/481 118/724 |
| 7,112,763 B2 * | 9/2006 | Hunter | ..................... | F27B 5/04 118/50.1 |
| 7,942,969 B2 * | 5/2011 | Riker | ................ | H01J 37/32357 118/715 |
| 7,978,964 B2 * | 7/2011 | Ranish | .................... | H01J 65/00 392/407 |
| 8,222,574 B2 * | 7/2012 | Sorabji | ............. | H01L 21/67109 118/725 |
| 8,335,419 B2 * | 12/2012 | Tabor | .................... | G02F 1/0115 385/120 |
| 8,367,976 B2 * | 2/2013 | Beer | .................... | H05B 3/0033 219/383 |
| 8,367,983 B2 * | 2/2013 | Ranish | .................. | H01L 21/67115 118/725 |
| 8,808,454 B2 * | 8/2014 | Lee | ................... | C23C 16/45565 118/715 |
| 8,824,875 B2 * | 9/2014 | Yamawaku | ......... | F27B 17/0025 392/407 |
| 8,901,518 B2 * | 12/2014 | Ranish | .................... | F25B 29/00 219/409 |
| 8,981,265 B2 * | 3/2015 | Jiao | ........................ | B64C 1/1476 219/497 |
| 8,986,454 B2 * | 3/2015 | Carlson | ............. | H01L 21/67115 118/715 |
| 9,157,586 B1 * | 10/2015 | Babcock, IV | .......... | F21V 9/083 |
| 9,411,169 B2 * | 8/2016 | Park | ........................ | G02B 27/48 |
| 2002/0060774 A1 * | 5/2002 | Chen-Lieh | ............. | A63B 33/00 351/43 |
| 2004/0156625 A1 * | 8/2004 | Garmer | ............. | H01L 21/67115 392/411 |
| 2007/0003259 A1 * | 1/2007 | Kaihori | ............. | H01L 21/67248 392/416 |
| 2007/0051706 A1 * | 3/2007 | Bovatsek | ........... | B23K 26/0617 219/121.69 |
| 2008/0069550 A1 * | 3/2008 | Timans | ................... | C30B 31/12 392/411 |
| 2008/0127895 A1 * | 6/2008 | Shao | ................... | C23C 16/45565 118/725 |
| 2008/0166793 A1 * | 7/2008 | Beer | ................. | B01L 3/502753 435/287.2 |
| 2008/0276864 A1 | 11/2008 | Koelmel et al. | | |
| 2010/0074604 A1 * | 3/2010 | Koelmel | ........... | H01L 21/67098 392/408 |
| 2011/0061810 A1 | 3/2011 | Ganguly et al. | | |
| 2011/0211789 A1 * | 9/2011 | Sasaoka | ............... | G02B 5/1871 385/31 |
| 2011/0283895 A1 * | 11/2011 | Veltrop | ................... | A23L 3/005 99/451 |
| 2011/0299282 A1 * | 12/2011 | Carlson | ............. | H01L 21/67115 362/253 |
| 2012/0070136 A1 | 3/2012 | Koelmel et al. | | |
| 2012/0213500 A1 * | 8/2012 | Koelmel | ................. | F27D 11/12 392/416 |
| 2013/0058080 A1 * | 3/2013 | Ge | ............................ | F21V 3/00 362/231 |
| 2013/0206362 A1 * | 8/2013 | Li | ..................... | H01L 21/67115 165/61 |
| 2014/0376896 A1 * | 12/2014 | Karazim | ............. | F16C 32/0696 392/416 |

FOREIGN PATENT DOCUMENTS

| | | | | |
|---|---|---|---|---|
| WO | WO-2011065112 A1 * | 6/2011 | ............ | B23K 26/18 |
| WO | 2012/021464 A2 | 2/2012 | | |

(56) References Cited

FOREIGN PATENT DOCUMENTS

OTHER PUBLICATIONS

Chinese Office Action for Application No. 201480032197.5 dated Dec. 1, 2017.
Chinese Office Action dated Jun. 6, 2018 for Application No. 201480032197.5.

* cited by examiner

LIGHT PIPE WINDOW STRUCTURE FOR THERMAL CHAMBER APPLICATIONS AND PROCESSES

CROSS-REFERENCE TO RELATED APPLICATIONS

This application claims benefit of U.S. Provisional Patent Application Ser. No. 61/956,997, filed Jun. 21, 2013, which is hereby incorporated by reference herein.

FIELD

Apparatus and methods for semiconductor processing are disclosed herein. More specifically, embodiments disclosed herein relate to a light pipe structure for thermal processing of semiconductor substrates.

BACKGROUND

Thermal processing is commonly practiced in the semiconductor industry. Semiconductor substrates are subjected to thermal processing in the context of many transformations, including deposition, doping, activation, and annealing of gate source, drain, and channel structures, siliciding, crystallization, oxidation, and the like. Over the years, techniques of thermal processing have progressed from simple furnace baking, to various forms of increasingly rapid thermal processing (RTP), spike annealing, as well as other thermal processes.

As the critical dimensions of semiconductor device features continue to shrink, more stringent constraints on thermal budgets are required during thermal processes. Many of the aforementioned thermal processes utilize lamp heating in the form of a lamphead consisting of a plurality of light sources positioned to direct radiant energy toward a substrate. However, the high intensity lamps utilized in the lamphead create high temperatures within the material of the lamphead. This temperature must be controlled for many processes to enable cooling of the substrate. For example, during RTP, thermal radiation from the lamps is generally used to rapidly heat a substrate in a controlled environment to a maximum temperature of up to about 1,350 degrees Celsius. This maximum temperature is maintained for a specific amount of time ranging from less than one second to several minutes depending on the process. The substrate is then cooled to room temperature for further processing. To enable the cooling to room temperature, the lamphead must be cooled. However, control of the temperature of the lamphead is difficult based on many factors. Additionally, the irradiance pattern of the light sources is sometimes irregular in conventional lampheads, which creates irregular heating of the substrate.

What is needed is a method and apparatus that enables improved temperature control of the lamphead within a thermal process chamber.

SUMMARY

Embodiments disclosed herein relate to a light pipe structure for thermal processing of semiconductor substrates.

In one embodiment, a light pipe window structure for use in a thermal processing chamber is described. The light pipe window structure includes a first transparent plate, a second transparent plate, a plurality of light pipe structures disposed between and bonded to the first transparent plate and the second transparent plate, each of the plurality of light pipe structures comprising a transparent material and having a longitudinal axis disposed in a substantially orthogonal relation to a plane of the first or the second transparent plate, and a peripheral housing joined with the first transparent plate and the second transparent plate and surrounding the plurality the plurality of light pipe structures.

In another embodiment, a light pipe window structure for use in a thermal processing chamber is described. The light pipe window structure includes a first transparent plate, a second transparent plate disposed an a substantially parallel relation to the first transparent plate, and a plurality of light pipe structures disposed between the first and the second transparent plate, wherein the first transparent plate has a thickness greater than a thickness of the second transparent plate.

In another embodiment, a substrate processing chamber is provided. The processing chamber includes a chamber having an interior volume, a light pipe window structure coupled to the chamber, the light pipe window structure having a first transparent plate in communication with the interior volume of the chamber, and a radiant heat source coupled to a second transparent plate of the light pipe window structure in a position outside of the interior volume of the chamber, wherein the light pipe window structure includes a plurality of light pipe structures disposed between the first transparent plate and the second transparent plate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to a light pipe window structure for a thermal processing chamber, such as deposition chambers, etch chambers, annealing chambers, implant chambers, chambers for light emitting diode formation, as well as other process chambers. The light pipe window structure may be utilized in process chambers available from Applied Materials, Inc. of Santa Clara, Calif., and may also be utilized in process chambers from other manufacturers as well.

Figure 1:
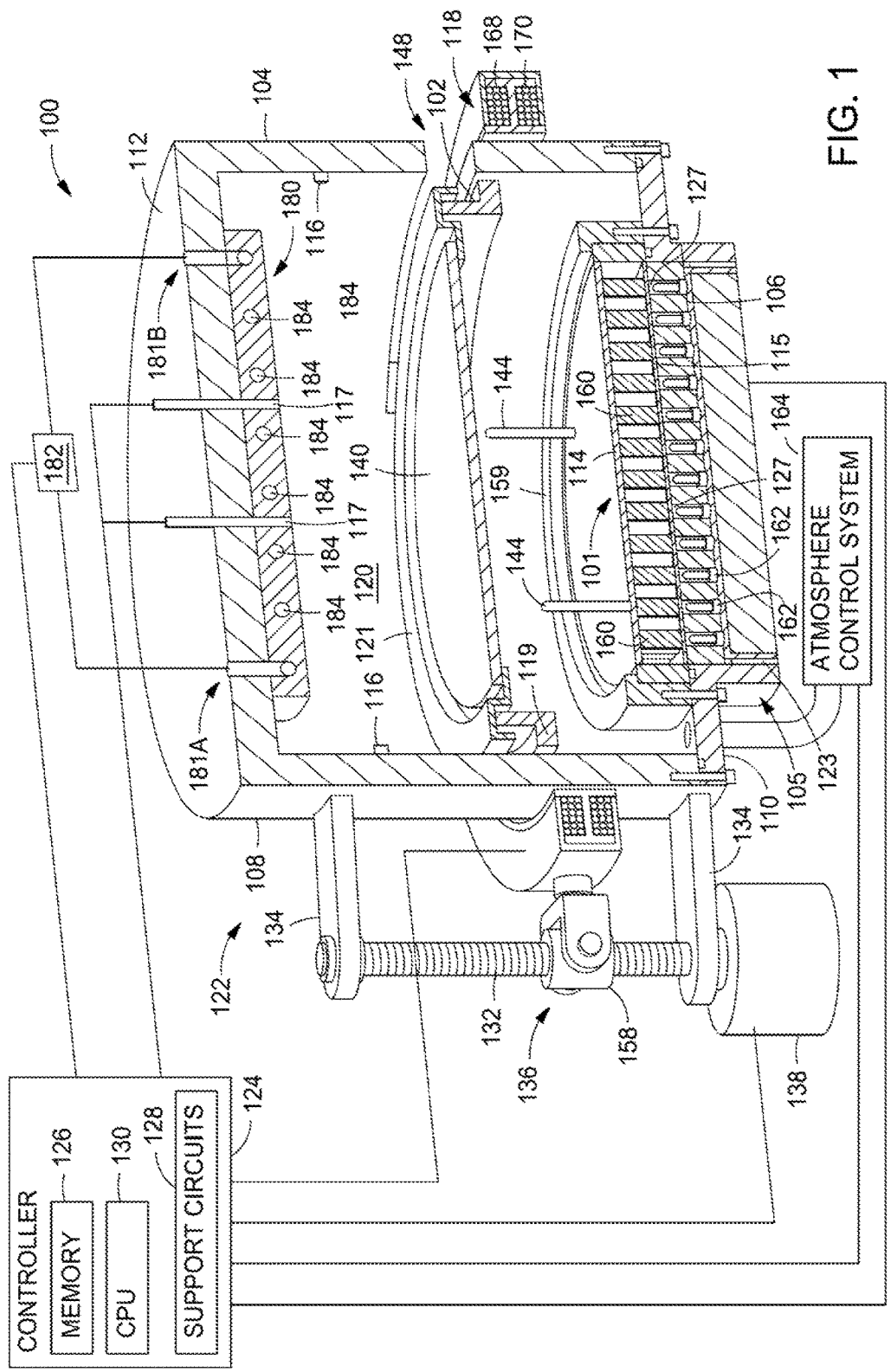
FIG. 1 is a simplified isometric view of a process chamber having one embodiment of a light pipe window structure.

FIG. 1 is a simplified isometric view of a rapid thermal process chamber 100 (RTP chamber) having a light pipe window structure 101 according to one embodiment. The process chamber 100 includes a contactless or magnetically levitated substrate support 102, and a chamber body 104 having a sidewall 108, a bottom 110, and a top 112 defining an interior volume 120. The sidewall 108 typically include a substrate access port 148 to facilitate entry and egress of a substrate 140 (a portion of which is shown in FIG. 1). The access port 148 may be coupled to a transfer chamber (not shown) or a load lock chamber (not shown) and may be selectively sealed with a valve, such as a slit valve (not shown). In one embodiment, the substrate support 102 is annular and is sized to accommodate a lamphead assembly 105 in an inside diameter of the substrate support 102. The lamphead assembly 105 includes the light pipe window structure 101 and a radiant heat source 106.

The substrate support 102 is adapted to magnetically levitate and rotate within the interior volume 120. The substrate support 102 is capable of rotating while raising and lowering vertically during processing, and may also be raised or lowered without rotation before, during, or after processing. This magnetic levitation and/or magnetic rotation prevents or minimizes particle generation due to the absence or reduction of parts rotating and/or contact between parts moving relative to each other that are typically required to raise/lower and/or rotate the substrate support.

A stator assembly 118 circumscribes the sidewall 108 of the chamber body 104 and is coupled to one or more actuator assemblies 122 that control the elevation of the stator assembly 118 along the exterior of the chamber body 104. In one embodiment (not shown), the process chamber 100 includes three actuator assemblies 122 disposed radially about the chamber body, for example, at about 120 degree angles about the chamber body 104. The stator assembly 118 is magnetically coupled to the substrate support 102 disposed within the interior volume 120 of the chamber body 104. The substrate support 102 may comprise or include a magnetic portion to function as a rotor 119, thus creating a magnetic bearing assembly to lift and/or rotate the substrate support 102. A support ring 121 is coupled to the rotor 119 to support a peripheral edge of the substrate 140. The support ring 121 is sized to stably support the substrate 140 while minimally shielding portions of the backside of the substrate 140 from energy emitted by the radiant heat source 106. The stator assembly 118 includes a drive coil assembly 168 stacked on a suspension coil assembly 170. The drive coil assembly 168 is adapted to rotate and/or raise/lower the substrate support 102 while the suspension coil assembly 170 may be adapted to passively center the substrate support 102 within the process chamber 100. Alternatively, the rotational and centering functions may be performed by a stator having a single coil assembly.

In one embodiment, each of the actuator assemblies 122 generally comprises a precision lead screw 132 coupled between two flanges 134 extending from the sidewall 108 of the chamber body 104. The lead screw 132 has a nut 158 that axially travels along the lead screw 132 as the screw rotates. A coupling 136 is placed between the stator assembly 118 and the nut 158, and couples the nut 158 to the stator assembly 118 so that as the lead screw 132 is rotated, the coupling 136 is moved along the lead screw 132 to control the elevation of the stator assembly 118 at the interface with the coupling 136. Thus, as the lead screw 132 of one of the actuator assemblies 122 is rotated to produce relative displacement between each of the nuts 158 of the other actuator assemblies 122, the horizontal plane of the stator assembly 118 changes relative to a central axis of the chamber body 104.

In one embodiment, a motor 138, such as a stepper or servo motor, is coupled to the lead screw 132 to provide controllable rotation in response to a signal by the controller 124. Alternatively, other types of actuator assemblies 122 may be utilized to control the linear position of the stator assembly 118, such as pneumatic cylinders, hydraulic cylinders, ball screws, solenoids, linear actuators and cam followers, among others.

Examples of a RTP chamber that may be adapted to benefit from the embodiment disclosed herein are VANTAGE®, VULCAN®, and CENTURA® processing systems, available from Applied Materials, Inc., located in Santa Clara, Calif. Although the apparatus is described as utilized with a rapid thermal processing chamber as well as an epitaxial deposition chamber, embodiments described herein may be utilized in other processing systems and devices where lamp heating devices are used for heating.

The light pipe window structure 101 includes a first transparent plate 114 and a second transparent plate 115 made from a material transparent to heat and light of various wavelengths, which may include light in the infra-red (IR) spectrum. The first transparent plate 114 and the second transparent plate 115 have a plurality of light pipe structures 160 disposed therebetween. Each of the plurality of light pipe structures may include a columnar-shaped structure, among other shapes. The first transparent plate and the second transparent plate may have a substantially uniform thickness and may have a solid cross-section. For example, the first transparent plate 114 and the second transparent plate 115 may be free of perforations. The light pipe structures 160 are provided as light pipes through which photons from a plurality of energy sources 162 of the radiant heat source 106 may pass therethrough to heat the substrate 140 during processing. In one embodiment, each of the light pipe structures 160 may have a total internal reflection (TIR) property under ordinary conditions.

The process chamber 100 also includes one or more proximity sensors 116, which are generally adapted to detect the elevation of the substrate support 102 (or substrate 140) within the interior volume 120 of the chamber body 104. The sensors 116 may be coupled to the chamber body 104 and/or other portions of the process chamber 100 and are adapted to provide an output indicative of the distance between the substrate support 102 and the top 112 and/or bottom 110 of the chamber body 104, and may also detect misalignment of the substrate support 102 and/or substrate 140.

The lamphead assembly 105 may include both of the radiant heat source 106 and the light pipe window structure 101. The light pipe window structure 101 may include a peripheral housing 159 that at least partially surrounds the light pipe window structure 101. The radiant heat source 106 includes a lamp assembly formed from a housing 123 which includes a plurality of closely spaced tubes 127. The tubes 127 may be formed in a honeycomb-like light pipe arrangement. Each tube 127 may contain a reflector and one high-intensity energy source 162, which may be a lamp, a laser, a laser diode, a light emitting diode, an IR emitter, or combinations thereof. Each tube 127 may be substantially axially aligned with each of the light pipe structures 160 of the light pipe window structure 101. The light pipe structures 160 are utilized to transmit energy emitted by each of the energy sources 162 toward the substrate 140. In one embodiment, the lamphead assembly 105 provides sufficient radiant energy to thermally process the substrate 140, for example, annealing a silicon layer disposed on the substrate 140. The lamphead assembly 105 may further comprise annular zones, wherein the voltage supplied to the plurality of energy sources 162 by the controller 124 may be varied to enhance the radial distribution of energy from the lamphead assembly 105. Dynamic control of the heating of the substrate 140 may be affected by the one or more temperature sensors 117 (described in more detail below) adapted to measure the temperature across the substrate 140.

In one embodiment, both of the first transparent plate 114 and the second transparent plate 115 are made from a quartz material (i.e., amorphous silica), although other materials that are transparent to energy, such as wavelengths in the infra-red spectrum, may be used, such as glass, sapphire, and alumino-silicate glasses. The first transparent plate 114 and the second transparent plate 115 may be made from a clear fused quartz material having low inclusion tolerances. The term "transparent", as used herein, refers to a substance which within its volume does not appreciably alter the direction or the power of a selected wavelength range of electromagnetic radiation. In one example, the average directional change of a selected wavelength range of electromagnetic radiation is less than a few degrees and the average power reduction is less than about 70%.

The first transparent plate 114 includes a plurality of lift pins 144 coupled to an upper surface of the first transparent plate 114 to facilitate transfer of the substrate into and out of the process chamber 100. For example, the stator assembly 118 may be actuated to move downward which causes the rotor 119 to move toward the lamphead assembly 105. Any direction used herein such as "downward" or "down" as well as "upward" or "up" are based on the orientation of the chamber in the drawings as shown and may not be the actual direction in practice.

The support ring 121, which supports the substrate 140, moves with the rotor 119. At a desired elevation, the substrate 140 contacts the lift pins 144 disposed on the first transparent plate 114. The downward movement of the rotor 119 (and support ring 121) may continue until the rotor 119 surrounds the peripheral housing 159 of the lamphead assembly 105. The downward movement of the rotor 119 (and support ring 121) continues until the support ring 121 is spaced a distance away from the substrate 140, which is stably supported on the lift pins 144. The height of the lift pins 144 may be chosen to support and align the substrate 140 along a plane that is substantially coplanar or adjacent a plane of the substrate access port 148. The plurality of lift pins 144 may be positioned between the light pipe structures 160 and radially spaced from each other to facilitate passage of an end effector (not shown) through the substrate access port 148. Alternatively, the end effector and/or robot may be capable of horizontal and vertical movement to facilitate transfer of the substrate 140. Each of the plurality of lift pins 144 may be positioned between the light pipe structures 160 to minimize absorption of energy from the radiant heat source 106. Each of the plurality of lift pins 144 may be made from the same material used for the first transparent plate 114, such as a quartz material.

The process chamber 100 also includes a controller 124, which generally includes a central processing unit (CPU) 130, support circuits 128 and memory 126. The CPU 130 may be one of any form of computer processor that can be used in an industrial setting for controlling various actions and sub-processors. The memory 126, or computer-readable medium, may be one or more of readily available memory such as random access memory (RAM), read only memory (ROM), floppy disk, hard disk, or any other form of digital storage, local or remote, and is typically coupled to the CPU 130. The support circuits 128 are coupled to the CPU 130 for supporting the controller 124 in a conventional manner. These circuits include cache, power supplies, clock circuits, input/output circuitry, subsystems, and the like.

An atmosphere control system 164 is also coupled to the interior volume 120 of the chamber body 104. The atmosphere control system 164 generally includes throttle valves and vacuum pumps for controlling chamber pressure. The atmosphere control system 164 may additionally include gas sources for providing process or other gases to the interior volume 120. The atmosphere control system 164 may also be adapted to deliver process gases for thermal deposition processes. During processing, the interior volume 120 is generally maintained at vacuum pressures. Aspects of the disclosure include embodiments where the lamphead assembly 105 is at least partially disposed in the interior volume 120 (and subject to negative pressure therein) while a portion of the lamphead assembly 105 is outside of the interior volume 120 (i.e., in ambient atmosphere). This arrangement provides efficient transmission of energy to the substrate 140 while enhancing the ability to control the temperature of the radiant heat source 106.

The process chamber 100 also includes one or more temperature sensors 117, which may be adapted to sense temperature of the substrate 140 before, during, and after processing. In the embodiment depicted in FIG. 1, the temperature sensors 117 are disposed through the top 112, although other locations within and around the chamber body 104 may be used. The temperature sensors 117 may be optical pyrometers, as an example, pyrometers having fiber optic probes. The sensors 117 may be adapted to couple to the top 112 in a configuration to sense the entire diameter of the substrate, or a portion of the substrate. The sensors 117 may comprise a pattern defining a sensing area substantially equal to the diameter of the substrate, or a sensing area substantially equal to the radius of the substrate. For example, a plurality of sensors 117 may be coupled to the top 112 in a radial or linear configuration to enable a sensing area across the radius or diameter of the substrate. In one embodiment (not shown), a plurality of sensors 117 may be disposed in a line extending radially from about the center of the top 112 to a peripheral portion of the top 112. In this manner, the radius of the substrate may be monitored by the sensors 117, which will enable sensing of the diameter of the substrate during rotation.

The process chamber 100 also includes a cooling block 180 adjacent to, coupled to, or formed in the top 112. Generally, the cooling block 180 is spaced apart and opposing the lamphead assembly 105. The cooling block 180 comprises one or more coolant channels 184 coupled to an inlet 181A and an outlet 181B. The cooling block 180 may be made of a process resistant material, such as stainless steel, aluminum, a polymer, or a ceramic material. The coolant channels 184 may comprise a spiral pattern, a rectangular pattern, a circular pattern, or combinations thereof and the channels 184 may be formed integrally within the cooling block 180, for example by casting the cooling block 180 and/or fabricating the cooling block 180 from two or more pieces and joining the pieces. Additionally or alternatively, the coolant channels 184 may be drilled into the cooling block 180. The inlet 181A and outlet 181B may be coupled to a coolant source 182 by valves and suitable plumbing and the coolant source 182 is in communication with the controller 124 to facilitate control of pressure and/or flow of a fluid disposed therein. The fluid may be water, ethylene glycol, nitrogen ($N_2$), helium (He), or other fluid used as a heat exchange medium.

As described herein, the process chamber 100 is adapted to receive a substrate in a "face-up" orientation, wherein the deposit receiving side or face of the substrate is oriented toward the cooling block 180 and the "backside" of the substrate is facing the lamphead assembly 105. The "face-up" orientation may allow the energy from the lamphead assembly 105 to be absorbed more rapidly by the substrate 140 as the backside of the substrate is may be less reflective than the face of the substrate.

Figure 2A:
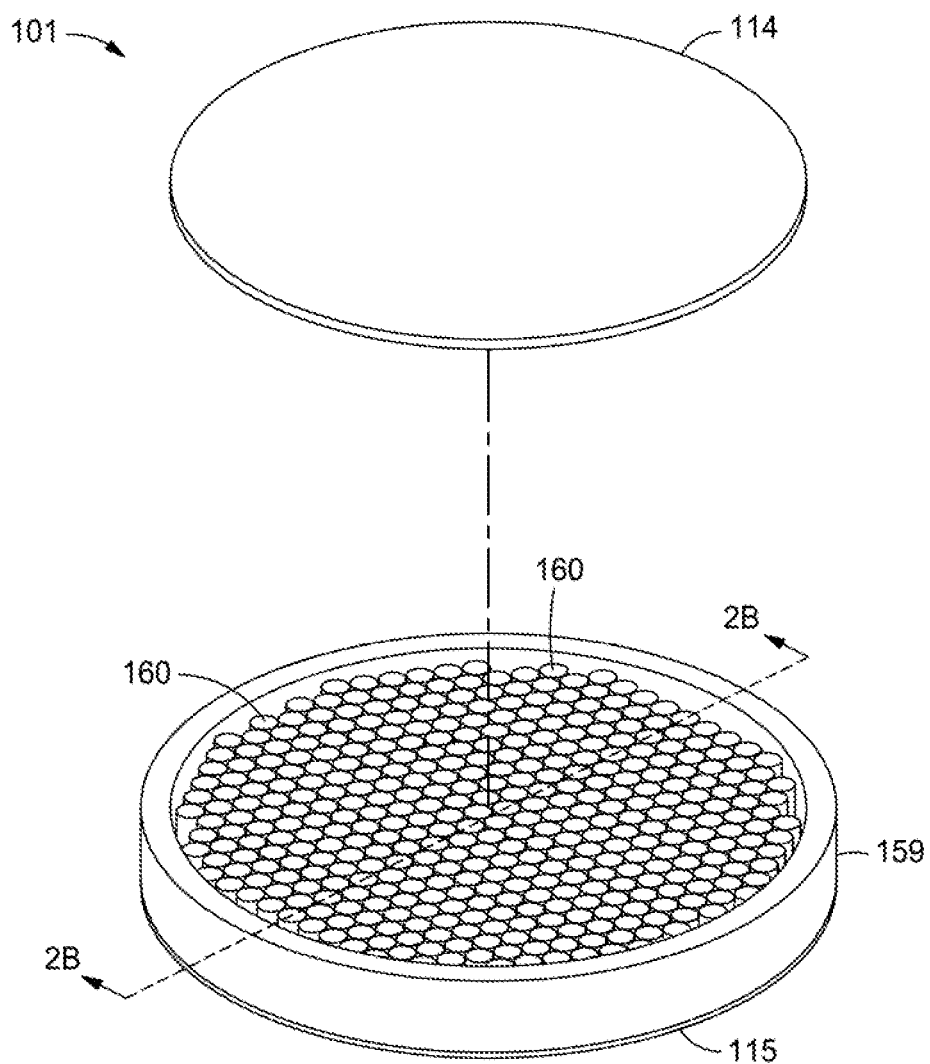
FIGS. 2A-2C are various views showing one embodiment of the light pipe window structure of FIG. 1.
Figure 2B:
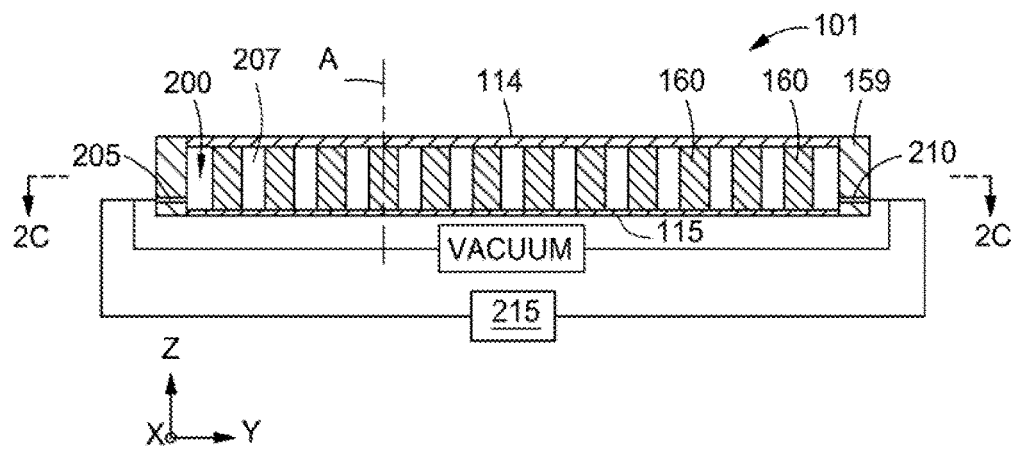
Figure 2C:
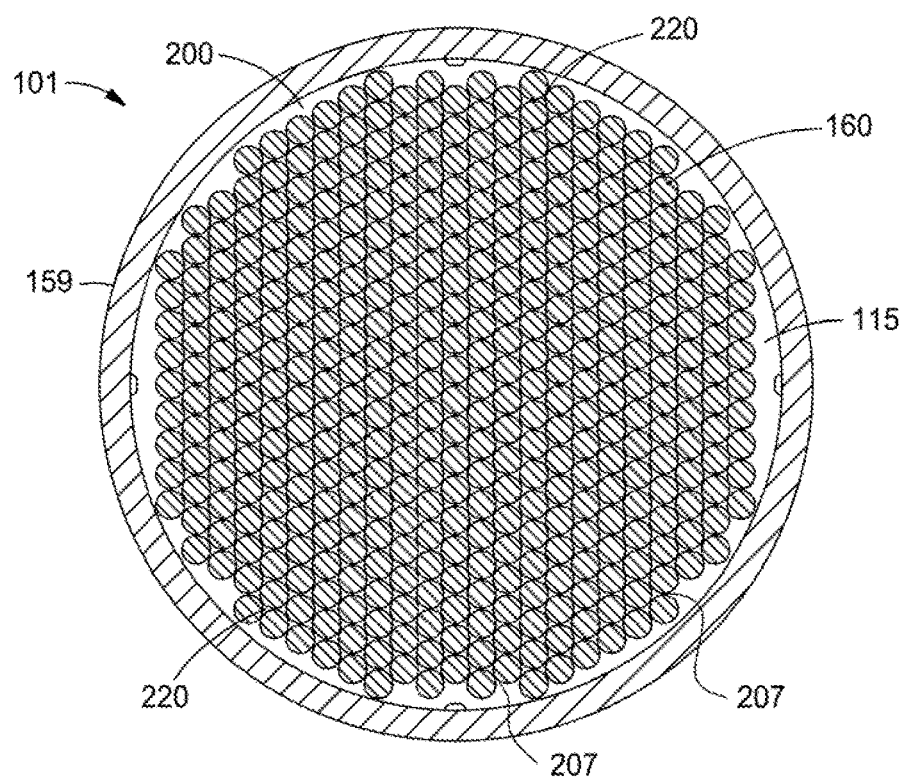

FIGS. 2A-2C are various views showing one embodiment of the light pipe window structure 101 that may be utilized in the process chamber 100 of FIG. 1. FIG. 2A is an isometric, partially exploded view of the light pipe window structure 101. FIG. 2B is a cross-sectional view of the light pipe window structure 101 across section lines 2B-2B of FIG. 2A. FIG. 2C is a cross-sectional view of the light pipe window structure 101 across section lines 2C-2C of FIG. 2B. The lift pins 144 shown in FIG. 1 are not shown in FIGS. 2A-2C.

The light pipe window structure 101 includes the peripheral housing 159, the first transparent plate 114, the second transparent plate 115 and the light pipe structures 160 sandwiched between the first transparent plate 114 and the second transparent plate 115. As shown, the first transparent plate 114 may be a solid, planar member that is coupled to the peripheral housing 159. The second transparent plate 115 may be a solid, planar member similar to the first transparent plate 114. Both of the first transparent plate 114 and the second transparent plate 115 may be made from an optically transparent material, such as quartz or sapphire. Likewise, the peripheral housing 159 may be made from an optically transparent material such as quartz. The term "optically transparent" as used herein is the ability of the material to transmit radiation, for example light waves or other wavelengths used for heating other objects and, in particular, wavelengths in the visible spectrum as well as non-visible wavelengths, such as in the infra-red (IR) spectrum. Both of the first transparent plate 114 and the second transparent plate 115 may be joined by a diffusion welding process or other suitable joining method. Each of the light pipe structures 160 may be solid, such as a rod made from an optically transparent material, for example the same material as the first transparent plate 114 and the second transparent plate 115 (i.e., fused quartz or sapphire). Alternatively, at least a portion of the light pipe structures 160 may be a hollow tube that is made of an optically transparent material such as quartz or sapphire.

The cross-section of the light pipe structures 160 may include circular shapes, rectangular shapes, triangular shapes, diamond shapes, or combinations thereof, or other polygonal and/or irregular shapes. In plan view, each of the light pipe structures 160 may include edges that are substantially parallel as shown in FIG. 2C, or edges that converge or diverge such that a cone shape is formed in plan view.

One method to form the light pipe window structure 101 includes sawing a block of an optically transparent material to produce the light pipe structures 160. A plate of optically transparent material may be precision sawed at specific angles and depths to produce light pipe structures 160 having polygonal shapes in cross-section as discussed above. If using a wire saw, the wire may be operated in a plane parallel to a major surface of the plate. The kerf may be utilized to form voids surrounding the light pipe structures 160. Forming the light pipe structures 160 to a specific depth in the material provides for one of the first transparent plate 114 or the second transparent plate 115 to be integral to the light pipe structures 160. The other transparent plate may be joined to the light pipe structures 160 by a joining process, such as ceramic solder techniques, seal glass bonding, a diffusion welding process or other suitable joining method. When rods or hollow tubes of optically transparent material are used for the light pipe structures 160, the light pipe structures 160 may be joined to one or both of the first transparent plate 114 and the second transparent plate 115 by a joining process, such as ceramic solder techniques, seal glass bonding, a diffusion welding process or other suitable joining method. The light pipe structures 160 are shown having a circular cross-section but in some embodiments the cross-sectional shape of at least a portion of the light pipe structures 160 may be hexagonal. The close-packed arrangement of light pipe structures 160 are sized and spaced to substantially axially align with each of the tubes 127 of the radiant heat source 106 (shown in FIG. 1) in one embodiment. However, some misalignment between the tubes 127 and the light pipe structures 160 may also be utilized to provide a high-power density and good spatial resolution. Further, as mentioned above, the irradiance pattern in some conventional lampheads is irregular, which may be due to manufacturing variations in the lamps. However, in some embodiments, the light pipe structures 160 of the light pipe window structure 101 may also produce a smoother irradiance pattern at the target plane (i.e., the surface of the substrate that is heated), thus making the lamphead assembly 105 less dependent on lamp-to-lamp manufacturing differences due to mixing within the light pipe structures 160.

As shown in FIG. 2B, each of the light pipe structures 160 include a longitudinal axis A that is substantially perpendicular to a plane of one or both of the first transparent plate 114 and the second transparent plate 115. When the first transparent plate 114 and the second transparent plate 115 are coupled to the peripheral housing 159, a sealed or sealed internal volume 200 may be contained within the interior sidewalls of the peripheral housing 159, as well as in voids 207 between the light pipe structures 160, the first transparent plate 114 and the second transparent plate 115. In some embodiments, the peripheral housing 159 may include an inlet port 205 and an outlet port 210. The inlet port 205 and the outlet port 210 may be coupled to a coolant source 215 which circulates a fluid through the sealed internal volume 200 as well as voids 207 between light pipe structures 160 in order to cool the light pipe window structure 101. The fluid may be water, ethylene glycol, nitrogen ($N_2$), helium (He), or other fluid used as a heat exchange medium. Small gaps 220 (shown in FIG. 2C) provide flow of the fluid around the light pipe structures 160 to facilitate cooling of each of the light pipe structures 160. In addition, or as an alternative, to flowing cooling fluid through the inlet port 205 and the outlet port 210, one or both of the inlet port 205 and the outlet port 210 may be coupled to a vacuum pump (shown in FIG. 2B) in order to provide a low pressure to the sealed internal volume 200, and the voids 207 and gaps 220 between the light pipe structures 160. The vacuum pump may be utilized to reduce the pressure in the sealed internal volume 200 and voids 207 thereby reducing a pressure gradient between the interior volume 120 and the sealed internal volume 200.

Referring again to FIG. 1, the first transparent plate 114 may be exposed to low pressures in the interior volume 120 of the chamber body 104. The pressure the first transparent plate 114 is exposed to may be about 80 Torr, or higher vacuum such as about 5 Torr to about 10 Torr. Bonding of the light pipe structures 160 to both of the first transparent plate 114 and the second transparent plate 115 provides additional structural rigidity to the first transparent plate 114 thus allowing the first transparent plate 114 to withstand the pressure differential without failure. In one embodiment, shown in FIG. 2B, the first transparent plate 114 is thicker than the second transparent plate 115 in order to withstand the low pressure in the interior volume 120. The thickness of the first transparent plate 114 may be between about 7 millimeters (mm) to about 5 mm, in one embodiment. In some embodiments, the first transparent plate 114 is about twice as thick as the second transparent plate 115. The dimensions of the light pipe structures 160 may include a major dimension, which may be a diameter, that is substantially equal to a major dimension (e.g., a diameter) of the tubes 127 of the radiant heat source 106. The length of the light pipe structures 160 may be about 10 mm to about 80 mm in one embodiment.

Figure 3:
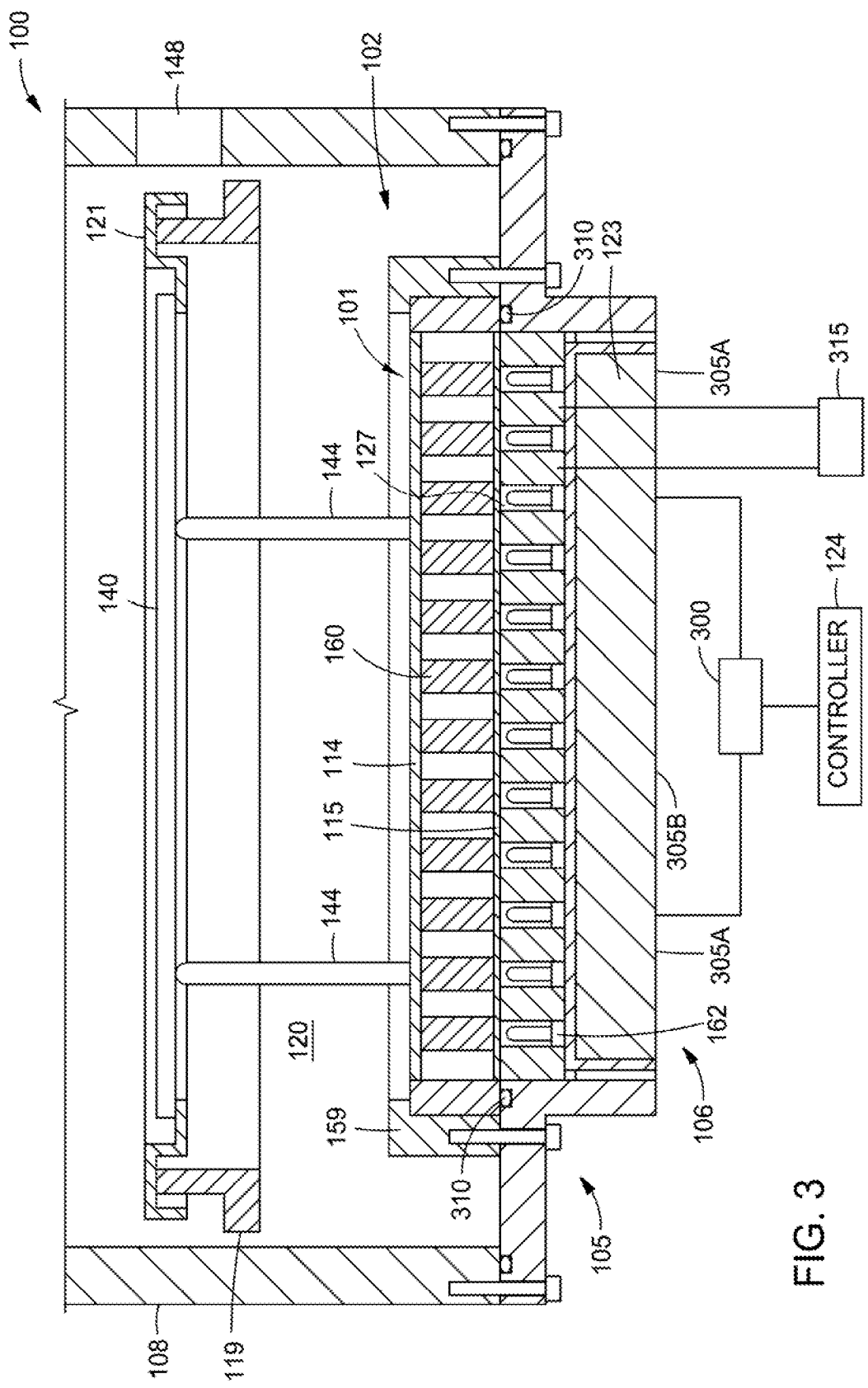
FIG. 3 is a side cross-sectional view of a portion of the process chamber of FIG. 1 showing details of the light pipe window structure and a lamphead assembly.

FIG. 3 is a side cross-sectional view of a portion of the process chamber 100 of FIG. 1. In this Figure, the substrate 140 is supported by the lift pins 144 and the support ring 121. The position of the substrate 140 may be used to begin a thermal process on the substrate 140 after transfer into the process chamber 100 where it may be heated by the radiant heat source 106. If the support ring 121 is hotter than the substrate 140, open loop heating by the radiant heat source 106 may be utilized to raise the temperature of the substrate (supported by the lift pins 144) to near the temperature of the support ring 121 in order to prevent thermal stress in the substrate 140. When heated sufficiently the substrate 140 may be transferred to the support ring 121 and raised away from the lift pins 144 to allow rotation of the substrate 140 during processing.

In order to heat the substrate 140, the energy sources 162 of the radiant heat source 106 are provided with power from a power source 300. The power source 300 may be a multi-zone power source providing energy to one or more groups of the energy sources 162 of the radiant heat source 106. For example, a first or outer zone 305A may include an outer set of energy sources 162 or subset of the energy sources 162 on the periphery of the housing 123. Likewise, a second or inner zone 305B may include a set or subset of the energy sources 162 within the outer zone 305A. In one embodiment, the energy sources 162 may be divided into about ten concentric zones that may be individually controlled in a closed loop heating regime.

When heating the substrate 140, the lamphead assembly 105, particularly the radiant heat source 106, experiences elevated temperatures, and the temperature of the radiant heat source 106 may be adequately controlled according to embodiments described herein. For example, at least a portion of the lamphead assembly 105 is disposed outside of the interior volume 120 of the process chamber 100 (i.e., in ambient pressure) which provides enhanced temperature control of the radiant heat source 106. The improved temperature control of the radiant heat source 106 facilitates greater efficiency of the process chamber 100.

In one embodiment, the radiant heat source 106 is coupled to a coolant source 315 to facilitate enhanced cooling of the housing 123 of the radiant heat source 106. The coolant source 315 may be coolant such as water, ethylene glycol, nitrogen ($N_2$), helium (He), or other fluid used as a heat exchange medium. The coolant may be flowed throughout the housing 123 and in between the energy sources 162 of the radiant heat source 106.

Figure 4:
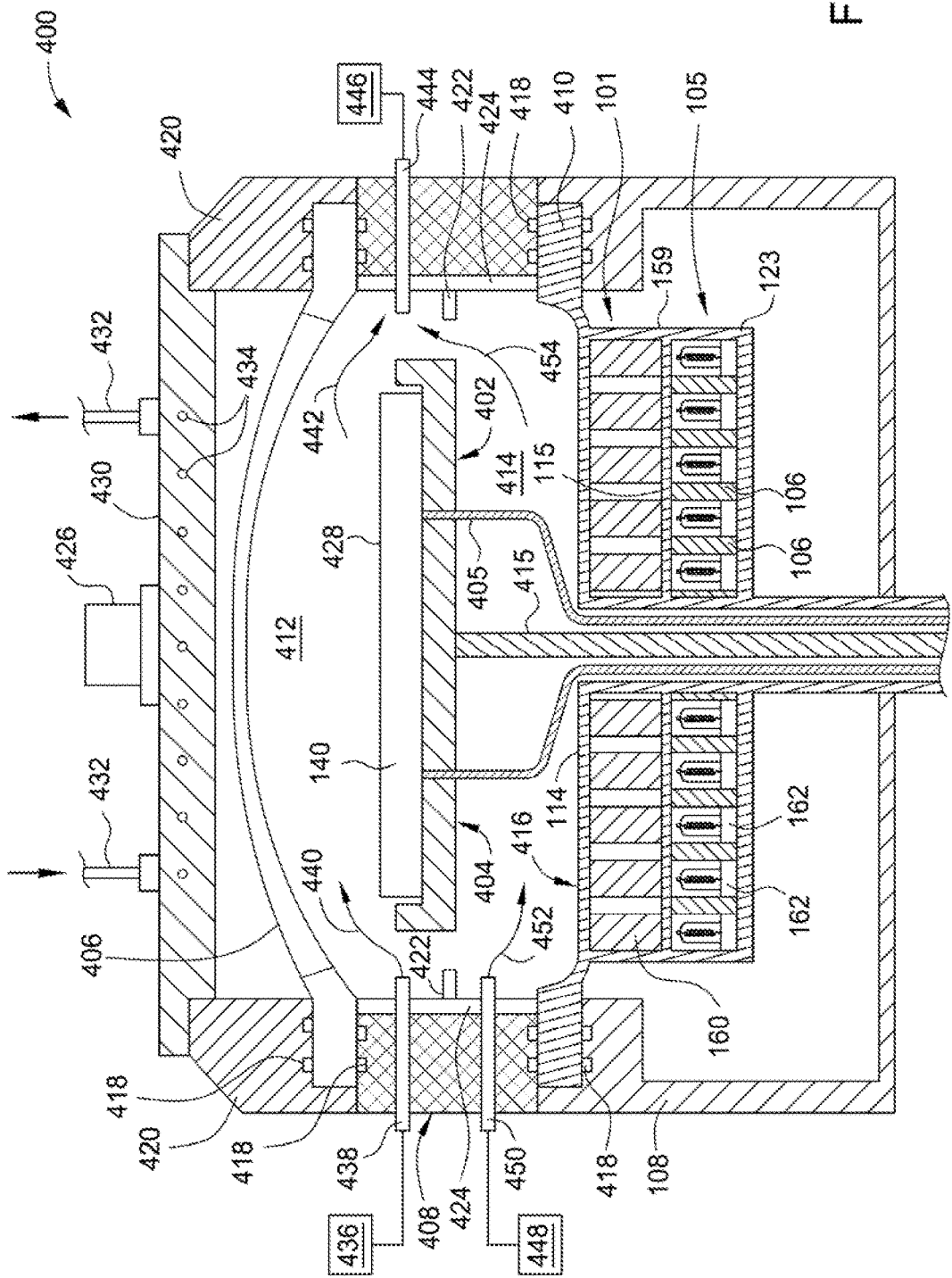
FIG. 4 is a schematic sectional view of a process chamber showing another embodiment of a light pipe window structure.

FIG. 4 illustrates a schematic sectional view of a process chamber 400 having another embodiment of the light pipe window structure 101 disposed thereon. The process chamber 400 may be used to process one or more substrates, including the deposition of a material on an upper surface of a substrate 140. While not discussed in detail herein, the deposited material may include gallium arsenide, gallium nitride, or aluminum gallium nitride. The process chamber 400 may include a lamphead assembly 105 as described herein, which includes an array of energy sources 162 for heating, among other components, a back side 402 of a substrate support 404 disposed within the process chamber 400. The substrate support 404 may be a disk-like substrate support 404 as shown, or may be a ring-like substrate support similar to the support ring 121 shown in FIGS. 1 and 3, which supports the substrate from the edge of the substrate to facilitate exposure of the substrate to the thermal radiation of the light pipe window structure 101. In FIG. 4, like reference numerals will be used with components similar to the components described in FIGS. 1-3, and unless noted, operate similarly and the description will not be repeated for brevity. Additionally, embodiments of the light pipe window structure 101 described in FIG. 4 may be utilized in the process chamber 100 of FIGS. 1 and 3, and vice versa.

The substrate support 404 is located within the process chamber 400 between an upper dome 406 and a first transparent plate 114 of the light pipe window structure 101. The upper dome 406, the upper surface of the first transparent plate 114 and a base ring 408, that is disposed between the upper dome 406 and a mounting flange 410 of the light pipe window structure 101, generally define an internal region of the process chamber 400. The substrate support 404 generally divides the internal volume of the process chamber 400 into a process region 412 that is above the substrate, and a purge region 414 below the substrate support 404. The substrate support 404 may be rotated during processing by a central shaft 415 to minimize the effect of thermal and process gas flow spatial anomalies within the process chamber 400 and thus facilitate uniform processing of the substrate 140. The substrate support 404 is supported by the central shaft 415, which may move the substrate 140 in a vertical direction (shown by arrows) during substrate transfer processes, and in some instances, processing of the substrate 140. The substrate support 404 may be formed from silicon carbide or graphite coated with silicon carbide to absorb radiant energy from the energy sources 162 and conduct the radiant energy to the substrate 140. A plurality of lift pins 405 may be disposed in the process chamber 400 outward of the central shaft 415. The lift pins 405 may be coupled to an actuator (not shown) to move the lift pins 405 vertically within the process chamber 400 relative to, and independent of, the substrate support 404. The substrate 140 can be transferred into the process chamber 400 and positioned onto the substrate support 404 through a loading port (not shown). The substrate support 404 is shown in an elevated processing position in FIG. 4, but may be vertically traversed by an actuator (not shown) to a loading position below the processing position to allow lift pins 405 to contact the substrate 140 and space the substrate 140 away from the substrate support 404. A robot (not shown) may then enter the process chamber 400 to engage and remove the substrate 140 therefrom though the loading port.

In general, the upper dome 406 and the first transparent plate 114 are formed from an optically transparent material such a quartz material, or a sapphire material as described above. In this embodiment, the first transparent plate 114 of the light pipe window structure 101 includes a recessed portion 416, which may provide additional structural rigidity to the light pipe window structure 101. The recessed portion 416 provides a concave or a dome shape to the light pipe window structure 101 and may enable thinner cross-sectional dimensions of one or both of the first transparent plate 114 and the second transparent plate 115 to provide structural rigidity while operating at lower pressures.

In one embodiment, the thickness of the light pipe window structure 101 having the first transparent plate 114 that is planar may be about 40 mm while the thickness of the light pipe window structure 101 having the first transparent plate 114 with a concave shape (e.g., the recessed portion 416 shown in FIG. 4) may be about 35 mm. In some embodiments, the first transparent plate 114 is about twice as thick as the second transparent plate 115. At least the first transparent plate 114 of the light pipe window structure 101 may be coupled to the mounting flange 410 which may be coupled between a sidewall 108 and the base ring 408. Seals 418, such as o-rings, may be used to seal the mounting flange 410 to the sidewall 108 and the base ring 408. The upper dome 406 may be coupled to the base ring 408 and a clamp ring 420 using seals 418 disposed therebetween for sealing.

The energy sources 162 may be configured to heat the substrate 140 to a temperature within a range of about 200 degrees Celsius to about 1,600 degrees Celsius. Each energy source 162 may be coupled to a power source 300 and a controller (shown in FIG. 3). The lamphead assembly 105 may be cooled during or after processing by a coolant source 315 as shown and described in FIG. 3. Alternatively or in addition, the lamphead assembly 105 may be cooled by convective cooling.

In one embodiment, at least a portion of one or both of the light pipe structures 160 and the energy sources 162 may be angled inwardly toward a central axis of the process chamber 400. For example, the light pipe structures 160 and/or the energy sources 162 near the central shaft 415 may tilted inwardly at about 30 degrees to about 45 degrees relative to a plane of the first transparent plate 114 to direct radiant energy toward a center region of the substrate support 404 (i.e., above the central shaft 415). In one example, radiant energy from at least a portion of the energy sources 162 pass through the transparent plate 114 at a non-normal angle relative to the plane of the transparent plate 114.

A circular shield 422 may be optionally disposed around the substrate support 404. The base ring 408 may also be surrounded by a liner assembly 424. The shield 422 prevents or minimizes leakage of heat/light noise from the energy source 162 to the device side 428 of the substrate 140 while providing a pre-heat zone for the process gases. The shield 422 may be made from CVD SiC, sintered graphite coated with SiC, grown SiC, opaque quartz, coated quartz, or any similar, suitable material that is resistant to chemical breakdown by process and purging gases. The liner assembly 424 is sized to be nested within or surrounded by an inner circumference of the base ring 408. The liner assembly 424 shields the processing volume (i.e., the process region 412 and purge region 414) from metallic walls of the process chamber 400. The metallic walls may react with precursors and cause contamination in the processing volume. While the liner assembly 424 is shown as a single body, the liner assembly 424 may include one or more liners.

The process chamber 400 may also include an optical pyrometer 426 for temperature measurement/control on the substrate 140. The temperature measurement by the optical pyrometer 426 may be performed on a device side 428 of the substrate 140. As a result, the optical pyrometer 426 may only sense radiation from the hot substrate 140, with minimal background radiation from the energy source 162 directly reaching the optical pyrometer 426. A reflector 430 may be optionally placed outside the upper dome 406 to reflect light that is radiating off the substrate 140 back onto the substrate 140. The reflector 430 may be secured to the clamp ring 420. The reflector 430 can be made of a metal such as aluminum or stainless steel. The efficiency of the reflection can be improved by providing a highly reflective coating layer such as gold (Au). The reflector 430 can have one or more ports 432 connected to a cooling source (not shown). The ports 432 may be connected to a passage 434 formed in or on the reflector 430. The passage 434 is configured to flow a fluid such as water or a gas, such as helium, nitrogen or other gas to cool the reflector 430.

In some embodiments, the light pipe window structure 101 may include one or more metrology light pipes 460 formed in, or disposed through, at least a portion of the light pipe window structure 101. The metrology light pipes 460 may comprise sapphire or other transparent material as described herein. The metrology light pipes 460 are utilized to couple with a sensor 462, such as an optical pyrometer, via an optional fiber optic cable 464, in one embodiment. The metrology light pipes 460 may have a diameter of about 1 mm to about 2 mm and are configured to be positioned between at least a portion of the light pipe structures 160. The metrology light pipes 460 may have a length that extends from a surface of the first transparent plate 114 to an end thereof disposed below the housing 123 of the lamphead assembly 105. Having one or more metrology light pipes 460, such as an array of metrology light pipes 460, at specific radial positions or zones within the light pipe window structure 101 just below the first transparent plate 114, allows for temperature sensing at a position that is significantly closer to the plane of the substrate support 104 and/or the substrate 140. The proximity of the metrology light pipes 460 to the substrate support 104 and/or the substrate 140 allows for a smaller measurement site, which enables finer temperature control.

Process gas may be supplied from a process gas source 436 is introduced into the process region 412 through a process gas inlet 438 formed in the sidewall of the base ring 408. The process gas inlet 438 is configured to direct the process gas in a generally radially inward direction. During a film formation process, the substrate support 404 may be located in the processing position, which is adjacent to and at about the same elevation as the process gas inlet 438, allowing the process gas to flow up and round along flow path 440 across the upper surface of the substrate 140 in a laminar flow regime. The process gas exits the process region 412 (along flow path 442) through a gas outlet 444 located on the side of the process chamber 400 opposite the process gas inlet 438. Removal of the process gas through the gas outlet 444 may be facilitated by a vacuum pump 446 coupled thereto. As the process gas inlet 438 and the gas outlet 444 are aligned to each other and disposed approximately at the same elevation, it is believed that such a parallel arrangement, when combined with the upper dome 406, will enable a generally planar, uniform gas flow across the substrate 140. Further radial uniformity may be provided by the rotation of the substrate 140 through the substrate support 404.

A purge gas may be supplied from a purge gas source 448 to the purge region 414 through an optional purge gas inlet 450 formed in the sidewall of the base ring 408. The purge gas inlet 450 is disposed at an elevation below the process gas inlet 438. If the circular shield 422 or a pre-heat ring (not shown) is used, the circular shield or the pre-heat ring may be disposed between the process gas inlet 438 and the purge gas inlet 450. In either case, the purge gas inlet 450 is configured to direct the purge gas in a generally radially inward direction. During a film formation process, the substrate support 404 may be located at a position such that the purge gas flows down and round along flow path 452 across a back side 402 of the substrate support 404 in a laminar flow regime. Without being bound by any particular theory, the flowing of the purge gas is believed to prevent or substantially avoid the flow of the process gas from entering into the purge region 414, or to reduce diffusion of the process gas entering the purge region 414 (i.e., the region under the substrate support 404). The purge gas exits the purge region 414 (along flow path 454) and is exhausted out of the process chamber through the gas outlet 444, which is located on the side of the process chamber 400 opposite the purge gas inlet 450.

Similarly, during the purging process, the substrate support 404 may be located in an elevated position to allow the purge gas to flow laterally across the back side 402 of the substrate support 404. It should be appreciated by those of ordinary skill in the art that the process gas inlet, the purge gas inlet and the gas outlet are shown for illustrative purpose, since the position, size, or number of gas inlets or outlet etc. may be adjusted to further facilitate a uniform deposition of material on the substrate 140. Another option may be to provide a purge gas through the process gas inlet 438. If desired, the purge gas inlet 450 may be configured to direct the purge gas in an upward direction to confine process gases in the process region 412.

Figure 5:
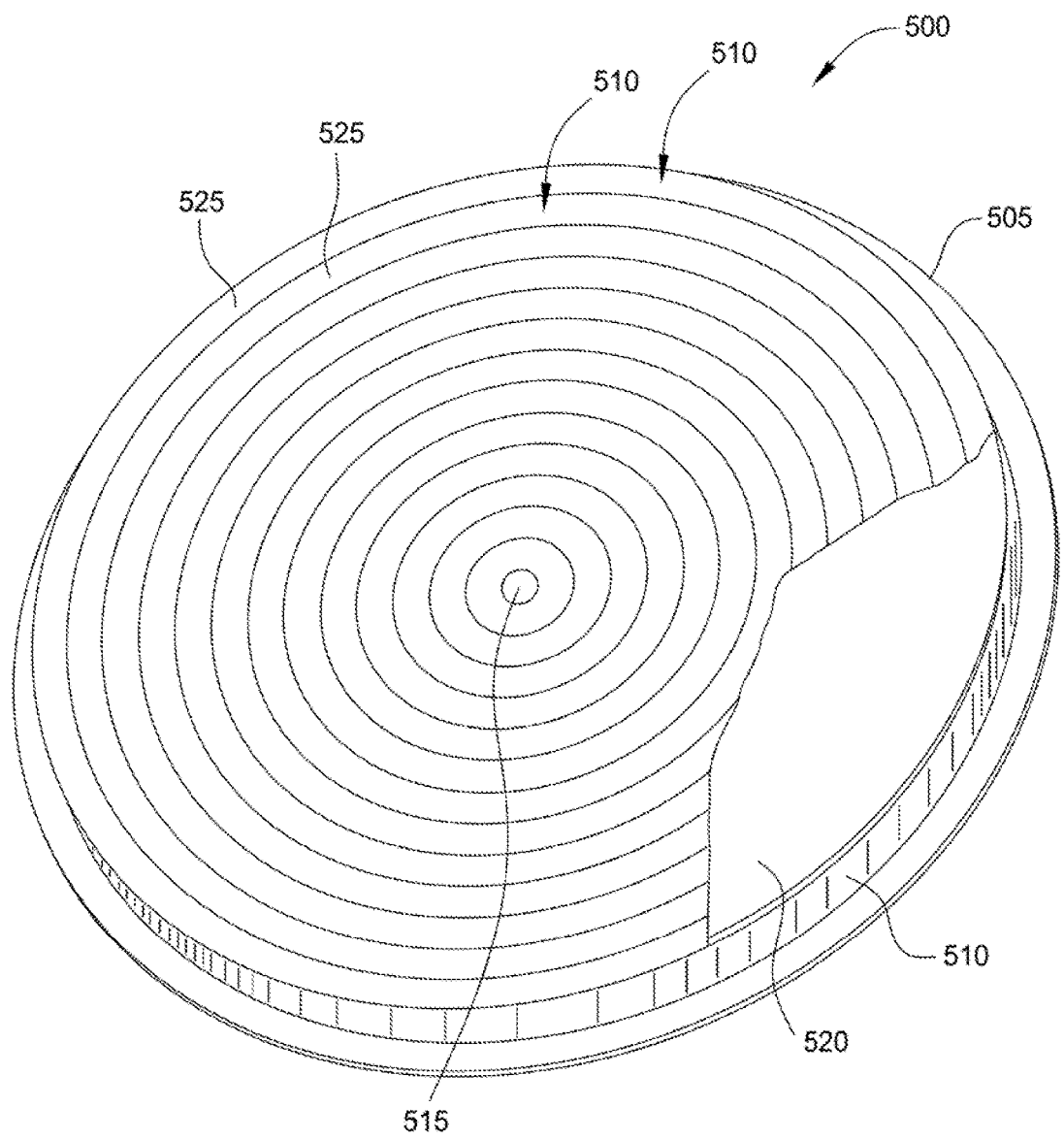
FIG. 5 is an isometric view of a portion of another embodiment of a light pipe window structure.

FIG. 5 is an isometric view of a portion of another embodiment of a light pipe window structure 500. The light pipe window structure 500 is shown with a first plate 505 which may be one of the first transparent plate 114 or the second transparent plate 115 described above with the light pipe window structure 101. The light pipe window structure 500 in this embodiment includes a plurality of light pipe structures in the form of annular ring sections 510, and may include an optional center structure 515 as another light pipe structure. The annular ring sections 510 may be concentric in one embodiment. The annular ring sections 510 may smooth radiance from each of the energy sources 162 (shown in FIGS. 1 and 4). The center structure 515 may be in the form of a cylinder, a rod, or other polygonal shape. An opposing second plate 520, that is partially shown in FIG. 5, is joined to a surface 525 of the annular ring sections 510 (and may include the uppermost surface of the center structure 515 when included) to form the light pipe window structure 500. At least a portion of the annular ring sections 510 may be complete rings or multiple arc segments forming a complete ring. The second plate 520 may be one of the first transparent plate 114 or the second transparent plate 115 described above with the light pipe window structure 101. The light pipe window structure 500 may be used with process chamber 100 or the process chamber 400 described in FIGS. 1, 3 and 4, respectively. When the light pipe window structure 500 is utilized with the process chamber 400, the center structure 515, as well as one or more of the innermost annular ring sections 510, may not be needed in order to provide access for the central shaft 415 and the lift pins 405 (shown in FIG. 4).

The annular ring sections 510 and the center structure 515 (when used), as well as the first plate 505 and the second plate 520 may be made from an optically transparent material, such as quartz or sapphire as described above with the light pipe window structure 101. The annular ring sections 510 and the center structure 515 (when used), as well as the first plate 505 and the second plate 520, may be coupled together by a joining process, such as ceramic solder techniques, seal glass bonding, a diffusion welding process or other suitable joining method. Although a housing, such as the peripheral housing 159 described in FIGS. 2B, 3 and 4, is not shown in FIG. 5, a housing may be joined to the first plate 505 and the second plate 520 to provide a sealed internal volume. In one embodiment, the outermost annular ring section 510 may be utilized as the housing when the first plate 505 and the second plate 520 are joined thereto.

Figure 6:
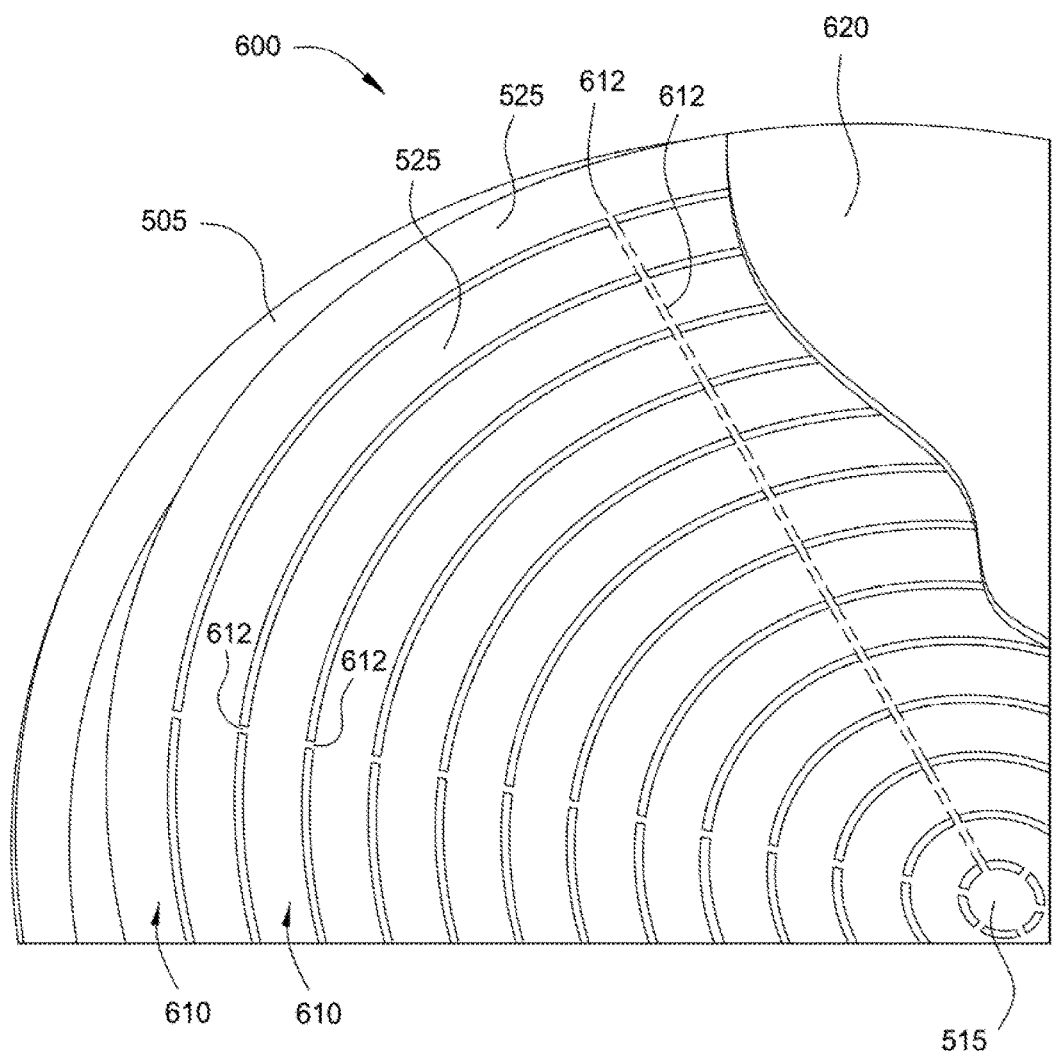
FIG. 6 is an isometric view of a portion of another embodiment of a light pipe window structure.

FIG. 6 is an isometric view of a portion of another embodiment of a light pipe window structure 600. The light pipe window structure 500 is shown with a first plate 505 which may be one of the first transparent plate 114 or the second transparent plate 115 described above with the light pipe window structure 101. The light pipe window structure 600 is similar to the light pipe window structure 500 described in FIG. 5, with the exception of spokes 612 disposed between and/or through (shown in phantom) light pipe structures comprising a plurality of annular ring sections 610. An opposing second plate 620, that is partially shown in FIG. 6, is joined to a surface 525 of the annular ring sections 610 (and may include the uppermost surface of the center structure 515 when included) to form the light pipe window structure 600. At least a portion of the annular ring sections 610 may be complete rings or multiple arc segments forming a complete ring having the spokes 612 disposed therebetween. The second plate 620 may be one of the first transparent plate 114 or the second transparent plate 115 described above with the light pipe window structure 101. The light pipe window structure 600 may be used with process chamber 100 or the process chamber 400 described in FIGS. 1, 3 and 4. When the light pipe window structure 600 is utilized with the process chamber 400, the center structure 515, as well as one or more of the innermost annular ring sections 610, may not be needed in order to provide access for the central shaft 415 and the lift pins 405 (shown in FIG. 4).

The spokes 612 may be utilized to reduce the tensile stress within the light pipe window structure 600. The spokes 612 may extend radially outward from the center structure 515 to an outermost annular ring section 610. The spokes 612 may be positioned symmetrically between or through the annular ring sections 610 in a geometrically symmetrical pattern, such as in about 30 degree intervals, 45 degree intervals, 60 degree intervals or 90 degree intervals. The annular ring sections 610, the spokes 612 and the center structure 515 (when used), as well as the first plate 605 and the second plate 620 may be made from an optically transparent material, such as quartz or sapphire as described above with the light pipe window structure 101. The annular ring sections 610, the spokes 612 and the center structure 515 (when used), as well as the first plate 605 and the second plate 620, may be coupled together by a joining process, such as ceramic solder techniques, seal glass bonding, a diffusion welding process or other suitable joining method. Although a housing, such as the peripheral housing 159 described in FIGS. 2B, 3 and 4, is not shown in FIG. 6, a housing may be joined to the first plate 605 and the second plate 620 to provide a sealed internal volume. In one embodiment, the outermost annular ring section 610 may be utilized as the housing when the first plate 605 and the second plate 620 are joined thereto.

Utilization of the light pipe window structures 101, 500 and 600 as described herein allows a lamphead assembly 105 (shown in FIGS. 3 and 4) to be disposed outside of the chamber interior volume. In some embodiments, the first transparent plate 114 of the light pipe window structures 101, 500 and 600 as described herein provide a process chamber boundary (e.g., a boundary of the interior volume where processing occurs). Seals, such as o-rings and the like, may be utilized to seal the chamber interior volume 120 and allow the lamphead assembly 105 to be positioned external to the interior volume. Utilization of the light pipe window structures 101, 500 and 600 as described herein provides enhanced cooling of the lamphead assembly 105 and the housing 123 (shown in FIGS. 1, 3 and 4), while preserving intensity and/or the radiance pattern of the energy sources 162 (shown in FIGS. 1 and 4). For example, if the lamphead assembly 105 was positioned in the interior volume of a process chamber, the reduced pressure in the interior volume 120 may minimize convective cooling of the energy sources 162. Additionally, if the lamphead assembly 105 was positioned in the interior volume 120, the low pressure environment (and sometimes in combination with easily ionizable gases) can cause arcing of electrical connections to the energy sources 162 within the lamphead assembly 105.

While arcing may be reduced by utilizing lower voltage energy sources 162, embodiments of the light pipe window structures 101, 500 and 600 as described herein enable higher voltage energy sources 162 to be used without the possibility of arcing. Thus, utilization of the light pipe window structures 101, 500 and 600 as described herein enables convective cooling of the lamphead assembly 105 while preserving optical intensity and patterns provided by the energy sources 162. In addition, higher voltage energy sources 162 (with lower current draw) may be utilized which has many benefits. The low current/higher voltage energy sources 162 that may be used in the lamphead assembly 105 facilitates faster and/or intensified heating of the substrate 140. Additionally, lower current draw in the energy sources 162 enables the use of smaller conductors and smaller, more robust lamp seals, both of which save money and minimize the use of space in the lamphead assembly 105.

While the foregoing is directed to specific embodiments, other and further embodiments may be devised without departing from the basic scope thereof, and the scope thereof is determined by the claims that follow.

The invention claimed is:

1. A light pipe window structure for use in a thermal process chamber, the light pipe window structure comprising:
    a first transparent plate;
    a plurality of lift pins extending from a surface of the first transparent plate;
    a second transparent plate;
    a plurality of light pipe structures disposed between and adhered to the first transparent plate and the second transparent plate, each of the plurality of light pipe structures comprising a transparent material and having a longitudinal axis disposed in an orthogonal relation to a plane of the first transparent plate or the second transparent plate, wherein each of the plurality of light pipe structures comprises a non-hollow columnar structure; and
    a peripheral housing joined with the first transparent plate and the second transparent plate and surrounding the plurality of light pipe structures.

2. The light pipe window structure of claim 1, wherein the first transparent plate has a thickness greater than a thickness of the second transparent plate.

3. The light pipe window structure of claim 1, wherein each non-hollow columnar structure comprises a circular cross-section.

4. The light pipe window structure of claim 1, wherein the peripheral housing comprises a sealed enclosure.

5. The light pipe window structure of claim 1, wherein each of the plurality of lift pins are made of a transparent material.

6. The light pipe window structure of claim 1, wherein each of the plurality of light pipe structures are welded to the first transparent plate and the second transparent plate.

7. A light pipe window structure for use in a thermal processing chamber, the light pipe window structure comprising:
    a first transparent plate;
    a plurality of lift pins extending from a surface of the first transparent plate;
    a second transparent plate disposed in a parallel relation to the first transparent plate; and
    a plurality of light pipe structures disposed between the first transparent plate and the second transparent plate, wherein the first transparent plate has a thickness greater than a thickness of the second transparent plate, and wherein each of the plurality of light pipe structures comprises a non-hollow columnar structure.

8. The light pipe window structure of claim 7, wherein each non-hollow columnar structure comprises a circular cross-section.

9. The light pipe window structure of claim 7, wherein each of the plurality of lift pins are made of a transparent material.

10. The light pipe window structure of claim 7, wherein each of the plurality of light pipe structures are welded to the first transparent plate and the second transparent plate.

11. A light pipe window structure for use in a thermal process chamber, the light pipe window structure comprising:
    a first transparent plate;
    a second transparent plate;
    a plurality of light pipe structures disposed between and adhered to the first transparent plate and the second transparent plate, each of the plurality of light pipe structures comprising a transparent material and having a longitudinal axis disposed in an orthogonal relation to a plane of the first transparent plate or the second transparent plate;
    a plurality of lift pins extending from a surface of the first transparent plate; and
    a peripheral housing joined with the first transparent plate and the second transparent plate and surrounding the plurality of light pipe structures.

12. The light pipe window structure of claim 11, wherein the first transparent plate has a thickness greater than a thickness of the second transparent plate.

13. The light pipe window structure of claim 11, wherein each of the plurality of light pipe structures comprises a columnar structure.

14. The light pipe window structure of claim 13, wherein each columnar structure comprises a non-hollow structure having a circular cross-section.

15. The light pipe window structure of claim 13, wherein each columnar structure comprises a hollow structure having a circular cross-section.

16. The light pipe window structure of claim 11, wherein the peripheral housing comprises a sealed enclosure.

17. The light pipe window structure of claim 11, wherein each of the plurality of light pipe structures are welded to the first transparent plate and the second transparent plate.

* * * * *